(12) United States Patent
Murakami et al.

(10) Patent No.: US 9,027,478 B2
(45) Date of Patent: May 12, 2015

(54) SCREEN PRINTING DEVICE AND AN IMAGE RECOGNIZING METHOD IN THE SCREEN PRINTING DEVICE

(75) Inventors: Toshiyuki Murakami, Yamanashi (JP);
Minoru Murakami, Yamanashi (JP);
Yasuichi Okada, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 16 days.

(21) Appl. No.: 13/995,278

(22) PCT Filed: Jun. 27, 2012

(86) PCT No.: PCT/JP2012/004183
§ 371 (c)(1),
(2), (4) Date: Jun. 18, 2013

(87) PCT Pub. No.: WO2013/001815
PCT Pub. Date: Jan. 3, 2013

(65) Prior Publication Data
US 2013/0269559 A1    Oct. 17, 2013

(30) Foreign Application Priority Data

Jun. 29, 2011    (JP) .................................. 2011-144033

(51) Int. Cl.
*B41F 15/08*    (2006.01)
*B41F 15/14*    (2006.01)
(Continued)

(52) U.S. Cl.
CPC .............. *B41F 15/14* (2013.01); *B41F 15/0813* (2013.01); *H05K 1/0269* (2013.01); *H05K 3/1233* (2013.01); *H05K 2203/0139* (2013.01); *H05K 3/3484* (2013.01)

(58) Field of Classification Search
USPC ........................................................ 101/486
See application file for complete search history.

(56) References Cited

U.S. PATENT DOCUMENTS 3,880,074 A * 4/1975 Seifert ........................... 101/126
4,636,080 A * 1/1987 Feldman ........................ 356/401
(Continued)

FOREIGN PATENT DOCUMENTS

CN          1642739 A       7/2005
EP          0 279 147 A2    8/1988
(Continued)

OTHER PUBLICATIONS

Office Action issued in Corresponding Chinese Patent Application No. 201280010612.8 dated Jun. 27, 2014.
(Continued)

*Primary Examiner* — Jill Culler
(74) *Attorney, Agent, or Firm* — Pearne & Gordon LLP

(57) ABSTRACT

An imaging part in a screen printing device which images a board and a screen mask includes a single camera which is disposed with a posture of horizontally facing towards an incidence optical axis, a half mirror which makes an imaging light, which is incident through a lower imaging optical axis, to be incident on a camera, and a mirror which makes an imaging light, which is incident through an upper imaging optical axis, to pass through the half mirror and to be incident on the camera, and further has an upper illuminating part and a lower illuminating part which individually illuminate respective imaging objects. Imaging light is taken in the camera in a state that the upper illuminating part and the lower illuminating part are individually operated in a mask imaging step and a board imaging step, respectively.

6 Claims, 7 Drawing Sheets

(51) Int. Cl.
    *H05K 1/02* (2006.01)
    *H05K 3/12* (2006.01)
    *H05K 3/34* (2006.01)

(56) References Cited

U.S. PATENT DOCUMENTS

| | | | |
|---|---|---|---|
| 4,782,751 A | 11/1988 | Colapinto | |
| 4,963,029 A * | 10/1990 | Kipphan | 356/401 |
| 5,752,446 A | 5/1998 | Squibb | |
| 5,777,878 A * | 7/1998 | Helmrich et al. | 101/481 |
| 7,225,734 B2 | 6/2007 | Schanz | |
| 7,458,318 B2 * | 12/2008 | Prince | 101/126 |
| 2005/0166772 A1 | 8/2005 | Schanz | |

FOREIGN PATENT DOCUMENTS

| | | |
|---|---|---|
| JP | 01-099286 A | 4/1989 |
| JP | 08-156224 A | 6/1996 |
| JP | 2007-294727 A | 11/2007 |

OTHER PUBLICATIONS

International Search Report for PCT/JP2012/004183 dated Jul. 24, 2012.

* cited by examiner

SCREEN PRINTING DEVICE AND AN IMAGE RECOGNIZING METHOD IN THE SCREEN PRINTING DEVICE

TECHNICAL FIELD

This invention relates to a screen printing device which prints paste such as cream solder on a board and an image recognizing method for imaging and recognizing a board or a mask in the screen printing device.

BACKGROUND ART

In a component mounting line for mounting electronic components on a board, screen printing is used as a method of supplying paste for bonding the components such as cream solder to the board. In the screen printing, by performing a squeegeeing operation of making a screen mask which is provided with pattern holes corresponding to printing positions of the paste to abut against the board, supplying paste onto the screen mask and sliding a squeegee, the paste is printed on the board through the pattern holes. In order to print the paste correctly in the screen printing, it is necessary to align the board with the screen mask correctly.

The board alignment is performed by imaging and recognizing the positions of recognition marks that are generally provided on the board and the screen mask, respectively, with a camera. At this time, because the position reference of the coordinate system when the board is imaged is different from that of the coordinate system when the screen mask is imaged, it is necessary to obtain the position reference data which identify the positional relationship between these coordinate systems. Therefore, traditionally, a screen printing device is known which includes a calibration processing function of obtaining the position reference data between the coordinate systems by imaging the board and the screen mask (for example, refer to a patent document 1). In the related art shown in this patent document, a construction example is shown which images a screen mask and a board with a single camera of an optical system including a prism, and imaging lights incident from the screen mask and the board in upwards and downwards coaxial directions are recognized by dividing the imaging field of the camera into a top half and a bottom half. By adopting such a construction, both the screen mask and the board can be recognized with the single camera, and it becomes possible to simplify the construction of the recognizing device.

RELATED ART DOCUMENTS

Patent Document

Patent document 1: U.S. Pat. No. 5,752,446

SUMMARY OF THE INVENTION

Problem to be Solved by the Invention

However, in the related art shown in the above-mentioned patent document, there are the following problems due to the construction of the imaging optical system. That is, in the above-mentioned related art, because the imaging optical system is so constructed that the screen mask and the board are recognized by dividing the imaging field of the camera into a top half and a bottom half, there are problems that the imaging range is small, the resolution is low, and the recognition precision is low. Because the imaging optical system is so constructed that the imaging lights are incident from the upwards and downwards coaxial directions, the optical axis at the mask side at the time of board mark recognition corresponds to a mask opening provided as a mask recognition mark. Therefore, the light that is incident from the mask opening located above acts as disturbance light at the time of board mark recognition, and it is a main factor of reducing the recognition precision. Thus, in the traditional screen printing device, when the recognizing device of a simple construction including a single camera is used, there is a problem that it is difficult to secure the recognition precisions of the screen mask and the board.

The present invention is intended to provide a screen printing device and an image recognizing method in the screen printing device so that by using a recognizing device of a simple construction including a single camera, the recognition precisions of the screen mask and the board can be secured.

Means for Solving Problem

The present invention provides with a screen printing device which makes a screen mask provided with a pattern hole to abut against a board so as to print a paste, comprising a board positioning part which holds a board transported from an upstream and positions the board to a predetermined position by moving the board relatively in a horizontal direction and in a vertical direction, a screen printing part which prints the paste on the board through the pattern hole by sliding a squeegee on the screen mask to which the paste is supplied, an imaging part which has an upper imaging optical axis and a lower imaging optical axis whose imaging directions are an upwards direction and a downwards direction, respectively, and whose planar positions are offset by a predetermined distance, the imaging part performing a mark imaging operation imaging a mask recognition mark formed on the screen mask through the upper imaging optical axis, and imaging a board recognition mark formed on the board through the lower imaging optical axis; and an imaging part moving mechanism which horizontally moves the imaging part relative to the board and the screen mask; wherein the imaging part comprises a single camera disposed with a posture of horizontally facing towards an incidence optical axis through which an imaging light is incident; a half mirror having a semi-reflective surface disposed to obliquely face downwards and towards the camera, and horizontally reflecting an imaging light, which is incident through the lower imaging optical axis, to be incident on the camera through the incidence optical axis, a mirror which has a full reflective surface that is disposed to obliquely face downwards and towards the camera, which is disposed at a position further than the half mirror from the camera, and which horizontally reflects an imaging light which is incident through the upper imaging optical axis to pass through the half mirror and then be incident on the camera through the incidence optical axis, and an upper illuminating part and a lower illuminating part which individually illuminate respective imaging objects at the time of imaging through the upper imaging optical axis and at the time of imaging through the lower imaging optical axis, and wherein the imaging part further comprises an illumination control part which switches to operate the upper illuminating part and the lower illuminating part according to the imaging objects.

The present invention provides with an image recognizing method, in which a board recognition mark and a mask recognition mark are imaged and recognized by an imaging part, in a screen printing device which makes a screen mask provided with a pattern hole to abut against a board so as to print a paste and which comprises a board positioning part which holds a board transported from an upstream and positions the board to a predetermined position by moving the board relatively in a horizontal direction and in a vertical direction, a screen printing part which prints the paste on the board through the pattern holes by sliding a squeegee on the screen mask to which the paste is supplied, the imaging part which has an upper imaging optical axis and a lower imaging optical axis whose imaging directions are an upwards direction and a downwards direction, respectively, and whose planar positions are offset by a predetermined distance, and which performs a mark imaging operation in which the mask recognition mark formed on the screen mask is imaged through the upper imaging optical axis, and the board recognition mark formed on the board is imaged through the lower imaging optical axis, and an imaging part moving mechanism which horizontally moves the imaging part relative to the board and the screen mask, wherein the imaging part comprises a single camera which is disposed with a posture of horizontally facing towards an incidence optical axis through which an imaging light is incident, a half mirror which has a semi-reflective surface which is disposed to obliquely face downwards and towards the camera, and which horizontally reflects an imaging light, which is incident through the lower imaging optical axis, to be incident on the camera through the incidence optical axis, a mirror which has a full reflective surface that is disposed to obliquely face downwards and towards the camera, which is disposed at a position further than the half mirror from the camera, and which horizontally reflects an imaging light, which is incident through the upper imaging optical axis, to pass through the half mirror and then be incident on the camera through the incidence optical axis, and an upper illuminating part and a lower illuminating part which individually illuminate respective imaging objects at the time of imaging through the upper imaging optical axis and at the time of imaging through the lower imaging optical axis, and wherein, in a mask imaging step of imaging the mask recognition mark, in a state that the upper illuminating part is operated, an imaging light of the mask recognition mark is incident on the mirror through the upper imaging optical axis, and in a board imaging step of imaging the board recognition mark, in a state that the lower illuminating part is operated, an imaging light of the board recognition mark is incident on the half mirror through the lower imaging optical axis.

Effect of the Invention

According to the present invention, the imaging part, which performs the mark imaging operation of imaging the mask recognition mark through the upper imaging optical axis and imaging the board recognition mark through the lower imaging optical axis, includes the single camera which is disposed with a posture of horizontally facing towards the incidence optical axis through which an imaging light is incident, the half mirror which makes an imaging light, which is incident through the lower imaging optical axis, to be incident on the camera, and the mirror which makes an imaging light, which is incident through the upper imaging optical axis, to pass through the half mirror and to be incident on the camera, and further has the upper illuminating part and the lower illuminating part which individually illuminate the imaging objects at the time of imaging through the upper imaging optical axis and at the time of imaging through the lower imaging optical axis, respectively. By adopting the imaging method of taking imaging light in the camera in a state that the upper illuminating part and the lower illuminating part are individually operated in the mask imaging step and the board imaging step respectively, the recognition precisions of the screen mask and the board can be secured by using the recognizing device of a simple construction including the single camera.

EMBODIMENTS OF THE INVENTION

Figure 1:
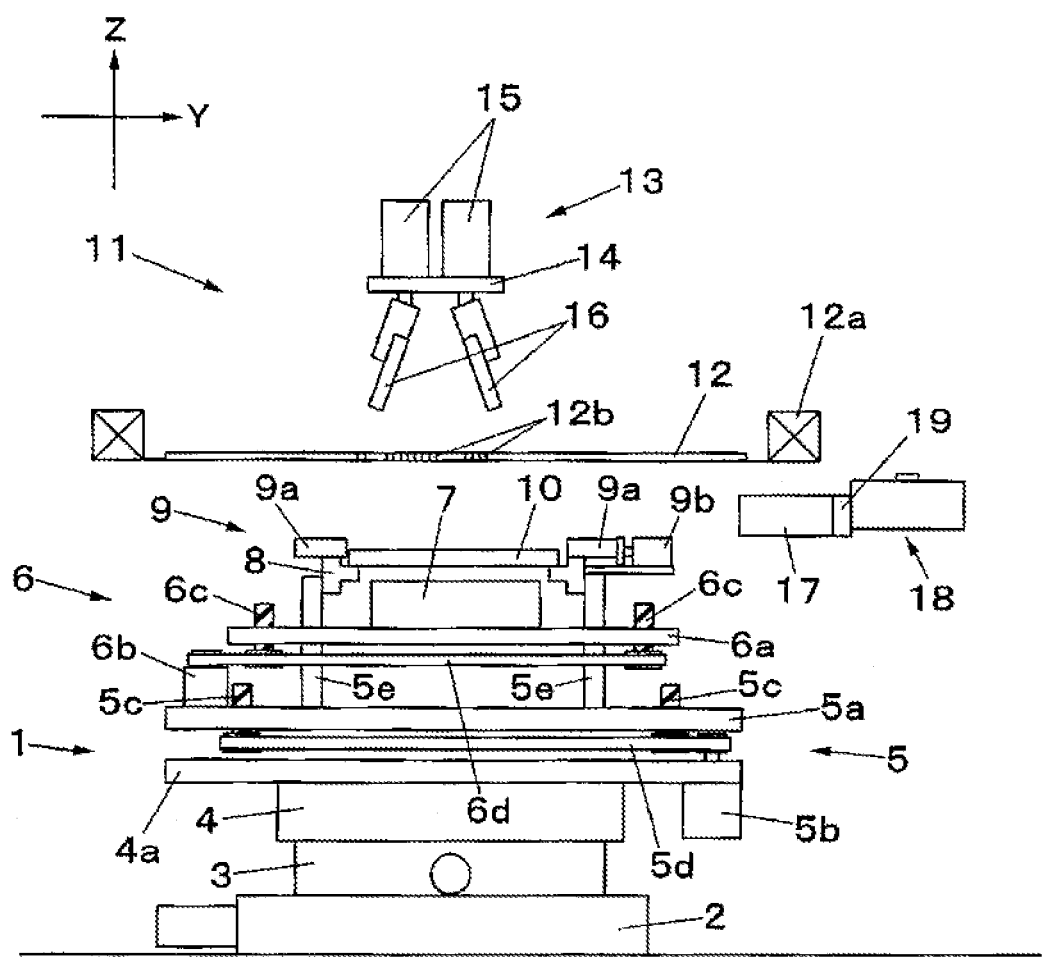
FIG. 1 is a side view of a screen printing device of one embodiment of the present invention.

Next, an embodiment of the invention is described with reference to the figures. First, with reference to FIGS. 1, 2 and 3, the construction of a screen printing device is described. In FIG. 1, the screen printing device is constructed by disposing a screen printing part 11 above a board positioning part 1. The board positioning part 1 has functions of holding a board transported from upstream and positioning the board to a predetermined position by moving the board in a horizontal direction and in a vertical direction. The board positioning part 1 is constructed by stacking a Y axis table 2, an X axis table 3 and a θ axis table 4, and further combining a first Z axis table 5 and a second Z axis table 6 thereon.

The construction of the first Z axis table 5 is described. Above a horizontal base plate 4a, which is provided on the top surface of the θ axis table 4, a similarly horizontal base plate 5a is held by an elevation guide mechanism (not shown in the figure) to be elevatable. The base plate 5a is elevated by a Z axis elevating mechanism which is so constructed that a plurality of forwarding screws 5c are rotationally driven through a belt 5d by a motor 5b.

Figure 2:
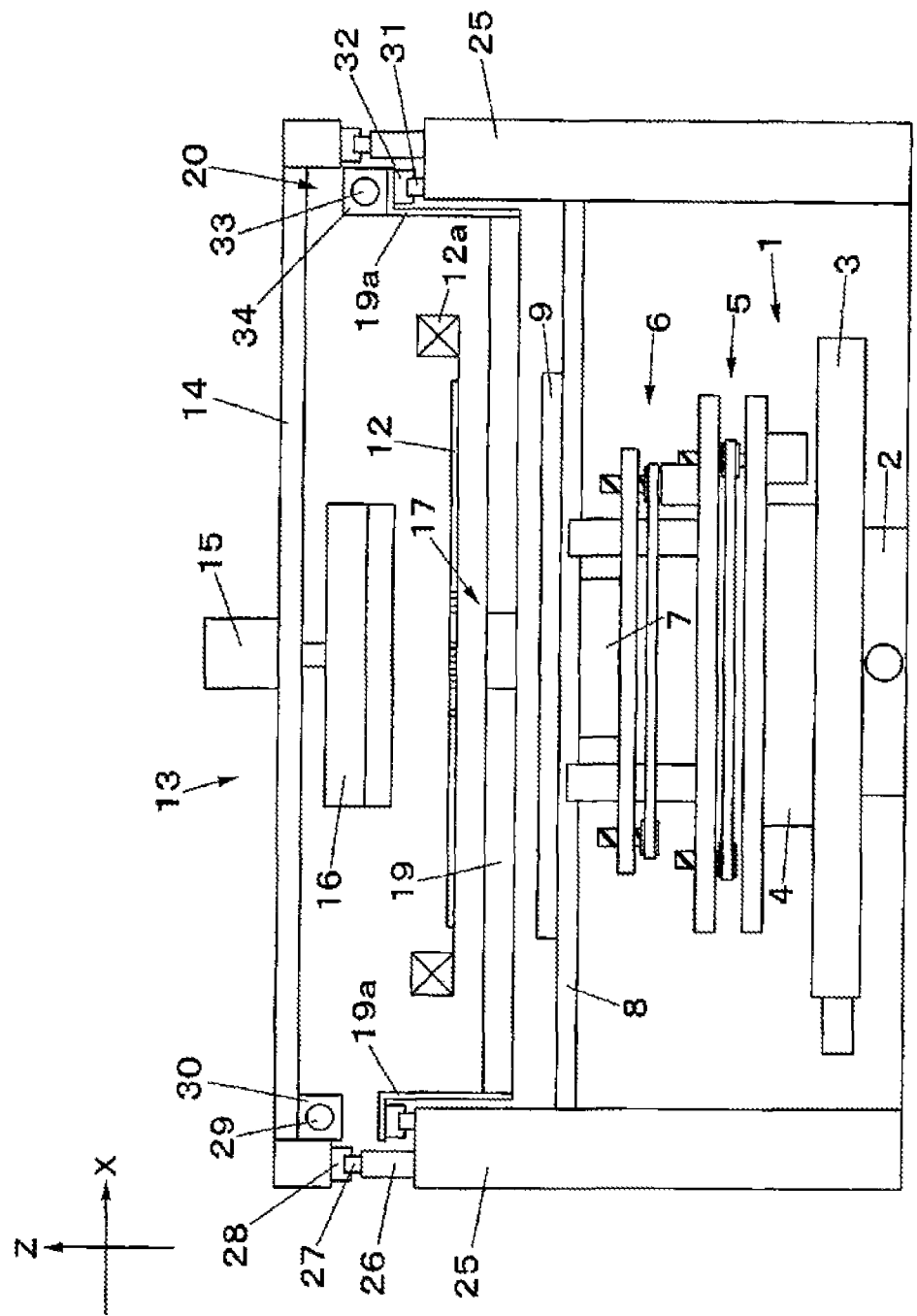
FIG. 2 is a front view of the screen printing device of the embodiment of the present invention.
Figure 3:
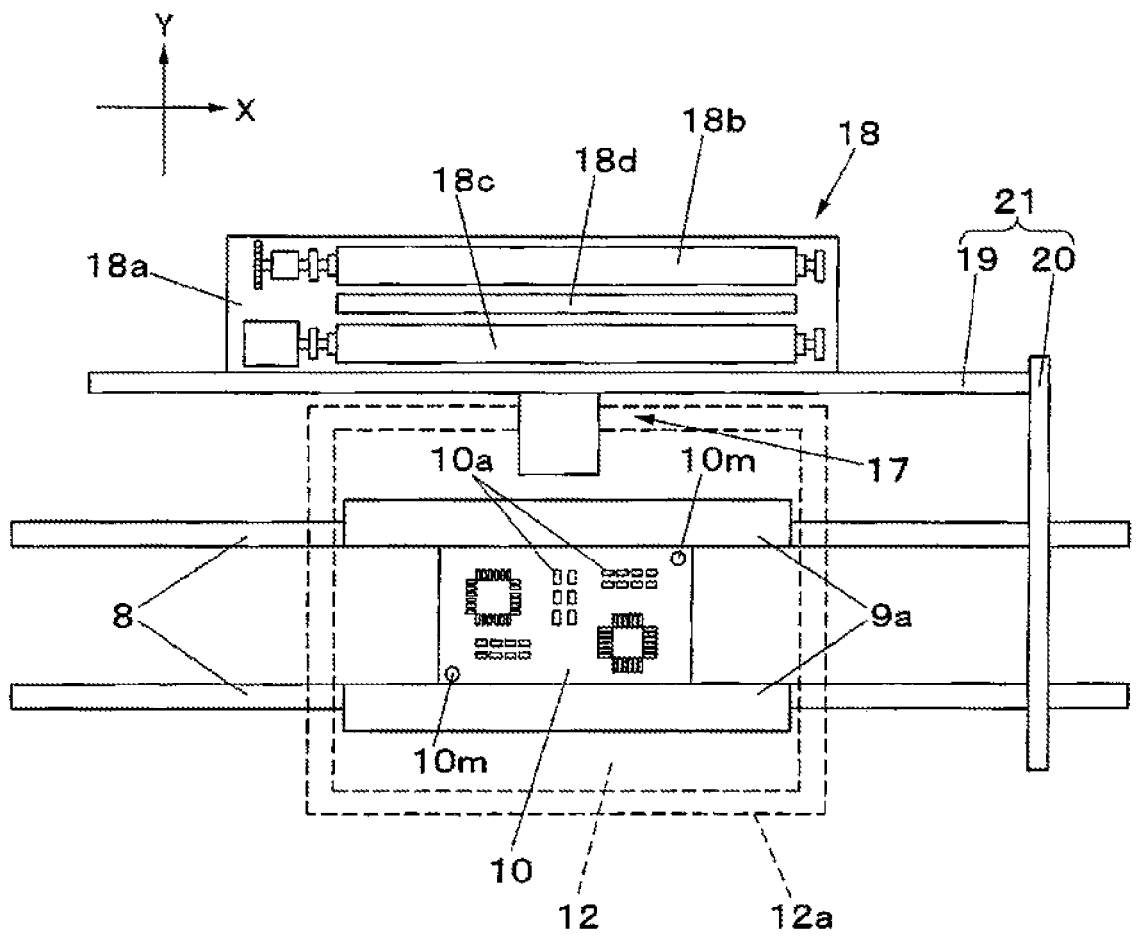
FIG. 3 is a top view of the screen printing device of the embodiment of the present invention.

Vertical frames 5e are raised on the base plate 5a, and a board conveying mechanism 8 is held at the upper ends of the vertical frames 5e. The board conveying mechanism 8 includes two conveyance rails which are disposed in parallel with a board conveying direction (X direction, or a direction perpendicular to the paper plane in FIG. 1), and both ends of a board 10 for the printing are supported and conveyed by these conveyance rails. By driving the first Z axis table 5, the board 10 which is held by the board conveying mechanism 8, can be elevated relative to a screen printing part to be described below together with the board conveying mechanism 8. As shown in FIGS. 2 and 3, the board conveying mechanism 8 extends towards an upstream side (left in FIGS. 2 and 3) and a downstream side, and the board 10 transported from upstream is conveyed by the board conveying mechanism 8, and is further positioned by the board positioning part 1. The board 10, after the printing is performed by the screen printing part 11 to be described below, is exported to the downstream side by the board conveying mechanism 8.

The construction of the second Z axis table 6 is described. Between the board conveying mechanism 8 and the base plate 5*a*, a horizontal base plate 6*a* is disposed to be elevatable along an elevation guide mechanism (not shown in the figure). The base plate 6*a* is elevated by a Z axis elevating mechanism which is so constructed that a plurality of forwarding screws 6*c* are rotationally driven through a belt 6*d* by a motor 6*b*. On the top surface of the base plate 6*a*, a board supporting part 7, in which a supporting surface which holds the board 10 is provided on the top surface, is disposed.

By driving the second Z axis table 6, the board supporting part 7 is elevated relative to the board 10 which is held to the board conveying mechanism 8. The board supporting part 7 supports the board 10 from below when the supporting surface of the board supporting part 7 abuts with the under surface of the board 10. A clamping mechanism 9 is disposed on the top surface of the board conveying mechanism 8. The clamping mechanism 9 includes two clamping members 9*a* which are arranged to be left-right opposed to each other, and when one clamping member 9*a* is moved back and forth by a driving mechanism 9*b*, the board 10 is clamped and fixed from both sides.

Next, the screen printing part 11, which is disposed above the board positioning part 1, is described. The screen printing part 11 has a function of printing paste on a board through pattern holes by making squeegees slide on a screen mask which the paste is supplied to. In FIGS. 1 and 2, a screen mask 12 is expanded to a mask frame 12*a*, and the screen mask 12 is provided with pattern holes 12*b* corresponding to the shapes and positions of electrodes 10*a* which are to be printed on the board 10 (refer to FIG. 3). A squeegee head 13 is disposed above the screen mask 12, and the squeegee head 13 is so constructed that squeegee elevating mechanisms 15 are disposed on a horizontal plate 14 to make squeegees 16 to be elevated. The squeegees 16 are elevated by driving the squeegee elevating mechanisms 15, and abut with the top surface of the screen mask 12.

As shown in FIG. 2, guide rails 27 are disposed in the Y direction on brackets 26 which are placed on a vertical frame 25, and sliders 28, which are slidably fitted with the guide rails 27, are coupled to two ends of the plate 14. Thereby, the squeegee head 13 becomes slidable in the Y direction. The plate 14 is horizontally moved in the Y direction by a squeegee moving means that includes a nut 30, a forwarding screw 29 and a squeegee moving motor (not shown in the figure) which rotationally drives the forwarding screw 29. Guide rails 31 are disposed in the Y direction on the vertical frame 25, and sliders 32, which are slidably fitted with the guide rails 31, are coupled to a head X axis table 19 through brackets 19*a*. Thereby, the head X axis table 19 becomes slidable in the Y direction.

As shown in FIG. 3, an imaging part 17, which images the board 10 and the screen mask 12, and a cleaning mechanism 18, which cleans the under surface of the screen mask 12, are coupled to the head X axis table 19. As shown in FIG. 3, the cleaning mechanism 18 is so constructed that a paper roll 18*b* which winds unused cleaning paper, a paper roll 18*c* which winds used cleaning paper, and a cleaning head 18*d* which presses the cleaning paper against the under surface of the screen mask 12 are disposed on a horizontal unit base 18*a*. The cleaning paper drawn out from the paper roll 18*b* is collected to the paper roll 18*c* via the cleaning head 18*d*.

The head X axis table 19 is horizontally moved in the Y direction by a head Y axis moving mechanism 20 that includes a nut 34, a forwarding screw 33 and a head moving motor (not shown in the figure) which rotationally drives the forwarding screw 33. The imaging part 17 and the cleaning mechanism 18 are horizontally moved in the X direction and in the Y direction by driving the head X axis table 19 and the head Y axis moving mechanism 20. Thereby, any positions of the board 10 and the screen mask 12 can be imaged, and the whole range of the under surface of the screen mask 12 can be cleaned. The head X axis table 19 and the head Y axis moving mechanism 20 constructs an imaging part moving mechanism 21 which moves the imaging part 17 horizontally relative to the board 10 and the screen mask 12.

Next, a printing operation of the screen printing part 11 is described. First, when the board 10 is transported to a printing position by the board conveying mechanism 8, the second Z axis table 6 is driven to move the board supporting part 7 upwards so that the under surface of the board 10 is supported from below. In this state, the board positioning part 1 is driven to align the board 10 with the screen mask 12. After that, the first Z axis table 5 is driven to move the board 10 upwards together with the board conveying mechanism 8 to abut with the under surface of the screen mask 12, and then the board 10 is clamped by the clamping mechanism 9. Thereby, in the squeegeeing of the squeegee head 13, a horizontal position of the board 10 is fixed. In this state, by making the squeegee 16 slide on the screen mask 12 where cream solder which is paste is supplied, the cream solder is printed on the board 10 through the pattern holes 12*b*.

Figure 4:
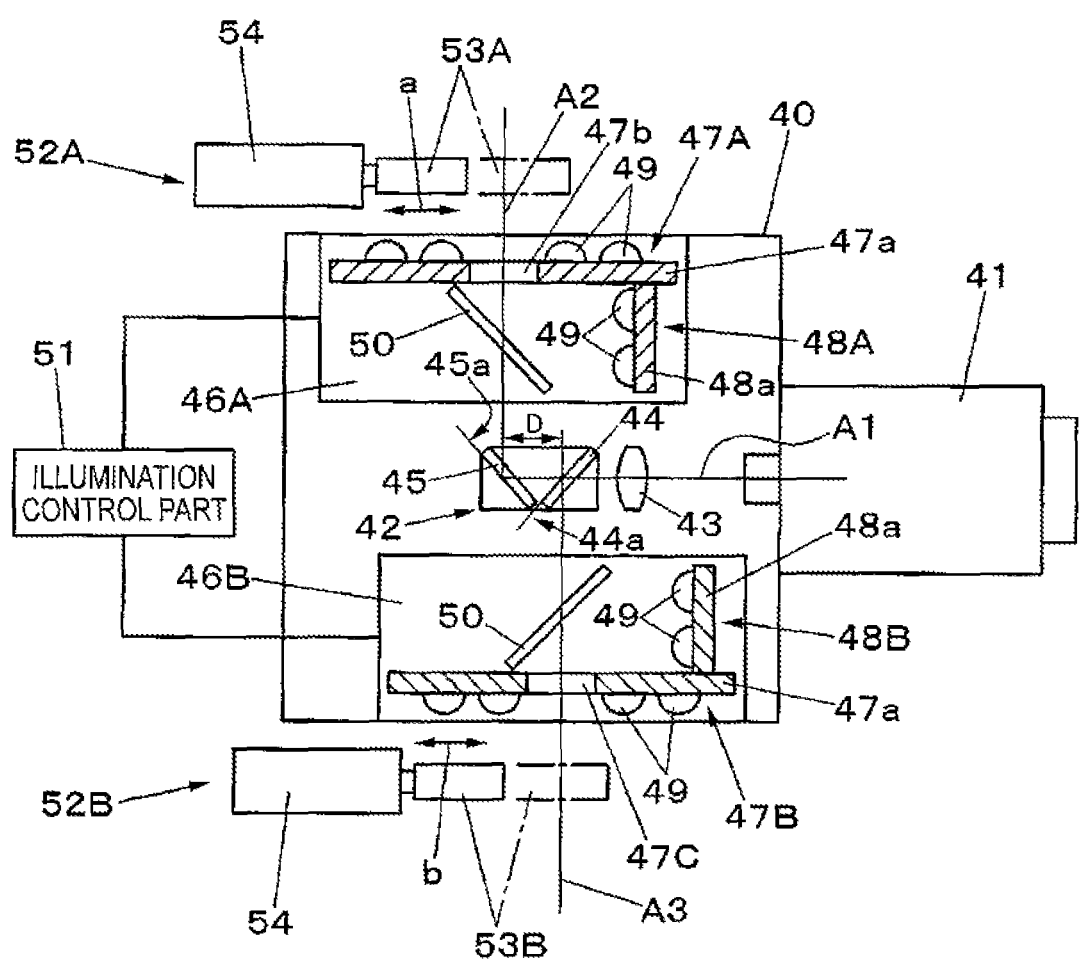
FIG. 4 is an illustration of the construction of an imaging part which is used in the screen printing device of the embodiment of the present invention.

Next, with reference to FIG. 4, the construction of the imaging part 17, which is coupled to the head X axis table 19, is described. As shown in FIG. 4, the imaging part 17 is so constructed that at one side end of a housing 40, a single camera 41 is disposed with a posture of horizontally facing towards an incidence optical axis A1 through which an imaging light is incident, and an imaging optical system 42, an upper illuminating part 46A and a lower illuminating part 46B are disposed inside the housing 40. The imaging optical system 42 is constructed by arranging an imaging lens 43, a half mirror 44 and a mirror 45 from the side of the camera 41 through the incidence optical axis A1. The lighting operation of the upper illuminating part 46A and the lower part illuminating part 46B is controlled by an illumination control part 51.

The half mirror 44 has a semi-reflective surface 44*a* which is disposed to obliquely face downwards and towards the camera 41, and an imaging light, which is incident through a lower imaging optical axis A3, is reflected horizontally to be incident on the imaging lens 43 and incident on the camera 41 through the incidence optical axis A1. The mirror 45 has a full-reflective surface 45*a* which is disposed to obliquely face upwards and towards the camera 41 at a position which is only a predetermined distance D further than the half mirror 44 from the camera 41. The mirror 45 horizontally reflects an imaging light incident through an upper imaging optical axis A2 to pass the half mirror 44 and be incident on the imaging lens 43, and then be incident on the camera 41 through the incidence optical axis A1. That is, the imaging part 17 is constructed to have the upper imaging optical axis A2 and the lower imaging optical axis A3 whose imaging directions are respectively an upwards direction and a downwards direction, and whose planar positions are offset only by a predetermined distance D which is the interval between the half mirror 44 and mirror 45.

The upper illuminating part 46A, which is arranged above the imaging optical system 42, has a function of illuminating an imaging object at the time of imaging through the upper imaging optical axis A2. The upper illuminating part 46A includes an illumination board 47A in which a plurality of LEDs 49 are arranged on the top surface of a horizontal board 47*a*, an illumination board 48A in which a plurality of LEDs 49 are arranged on the inside surface of a vertical board 48a, and a half mirror 50 obliquely opposed to the illumination board 48A.

An imaging opening 47b is provided to penetrate the board 47a, and the upper illuminating part 46A is so arranged that the upper imaging optical axis A2 passes through the half mirror 50 from below and further penetrates the imaging opening 47b. By operating the illumination board 47A, an illumination light is irradiated to the imaging object above, and by operating the illumination board 48A, an illumination light, which is reflected upwards by the half mirror 50, is irradiated to the imaging object from the coaxial direction of the upper imaging optical axis A2.

The lower illuminating part 46B, which is arranged above the imaging optical system 42, has a function of illuminating an imaging object at the time of imaging through the lower imaging optical axis A3. The lower illuminating part 46B includes an illumination board 48B in which a plurality of LEDs 49 are arranged on the bottom surface of a horizontal board 47a, an illumination board 48B in which a plurality of LEDs 49 are arranged on the inside surface of a vertical board 48a, and a half mirror 50 obliquely opposed to the illumination board 48B.

An imaging opening 47c is provided to penetrate the board 47a, and the lower illuminating part 46B is so arranged that the lower imaging optical axis A3 passes through the half mirror 50 from below and further penetrates the imaging opening 47c. By operating the illumination board 47B, an illumination light is irradiated to the imaging object below, and by operating the illumination board 48B, an illumination light, which is reflected downwards by the half mirror 50, is irradiated to the imaging object from the coaxial direction of the lower imaging optical axis A3. When the upper illuminating part 46A and the lower illuminating part 46B are controlled by the illumination control part 51, the upper illuminating part 46A and the lower illuminating part 46B can be switched to operate individually depending on the imaging objects above and below.

An upper shuttering mechanism 52A and a lower shuttering mechanism 52B are disposed above the upper illuminating part 46A and below the lower illuminating part 46B, respectively. The upper shuttering mechanism 52A and the lower shuttering mechanism 52B are so constructed that an upper shuttering member 53A and a lower shuttering member 53B are moved back and forth by back and forth driving mechanisms 54, respectively. By moving the upper shuttering member 53A back and forth (arrow a), the covering and the opening of the imaging opening 47b from above are switched. By moving the lower shuttering member 53B back and forth (arrow b), the covering and the opening of the imaging opening 47c from below are switched.

Figure 5:
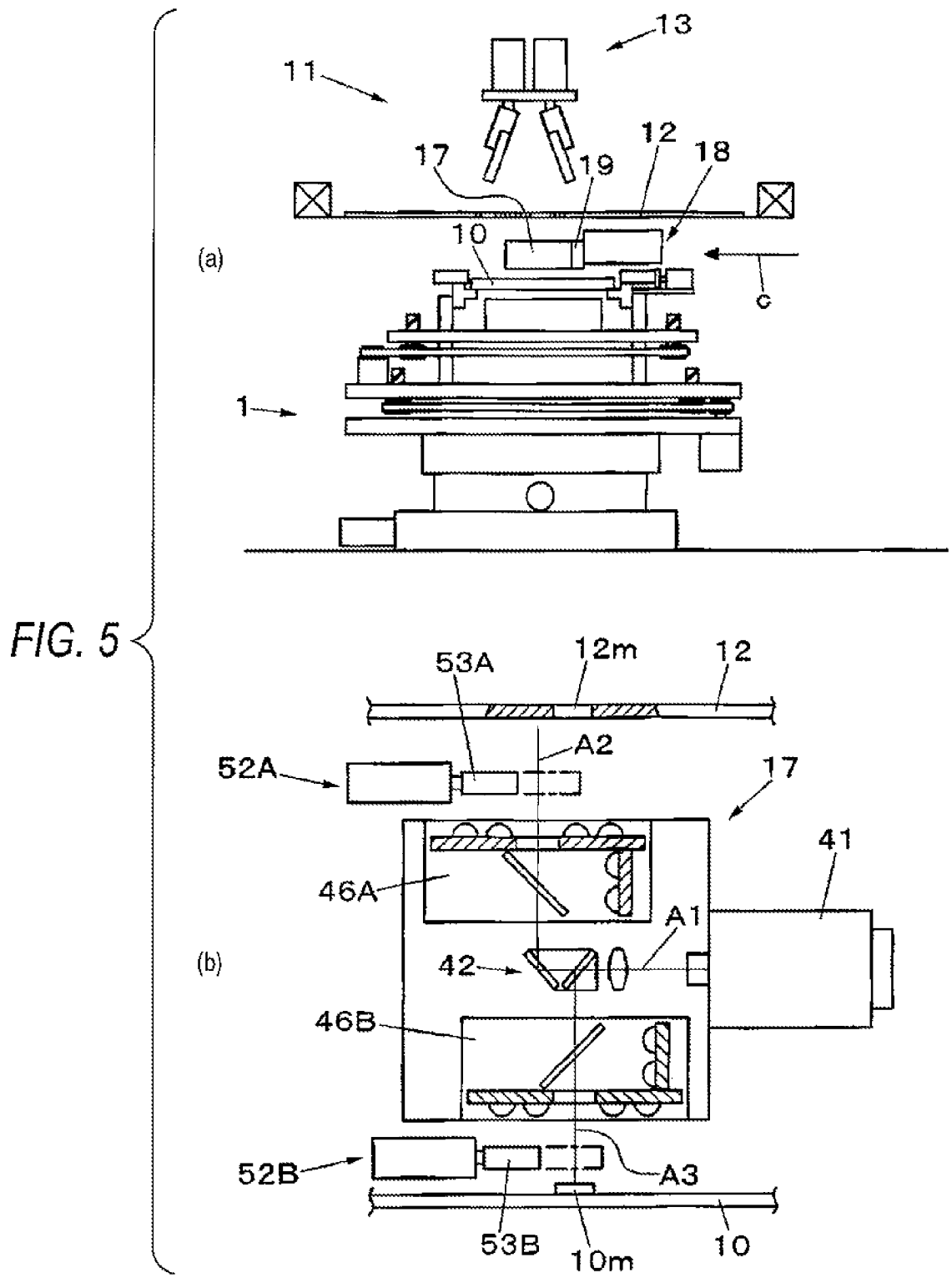
FIGS. 5(a) and 5(b) are function illustrations of the imaging part in the screen printing device of the embodiment of the present invention.

In an image recognizing method in which a mask recognition mark 12m and a board recognition mark 10m are imaged and recognized by the imaging part 17, as shown in FIG. 5(a), the imaging part moving mechanism is driven to move the imaging part 17 back and forth between the board 10 and the screen mask 12 (arrow c). Thereby, as shown in FIG. 5(b), a mark imaging operation is performed in which the mask recognition mark 12m formed on the screen mask 12 is imaged through the upper imaging optical axis A2, and the board recognition mark 10m formed on the board 10 is imaged through the lower imaging optical axis A3.

Figure 6:
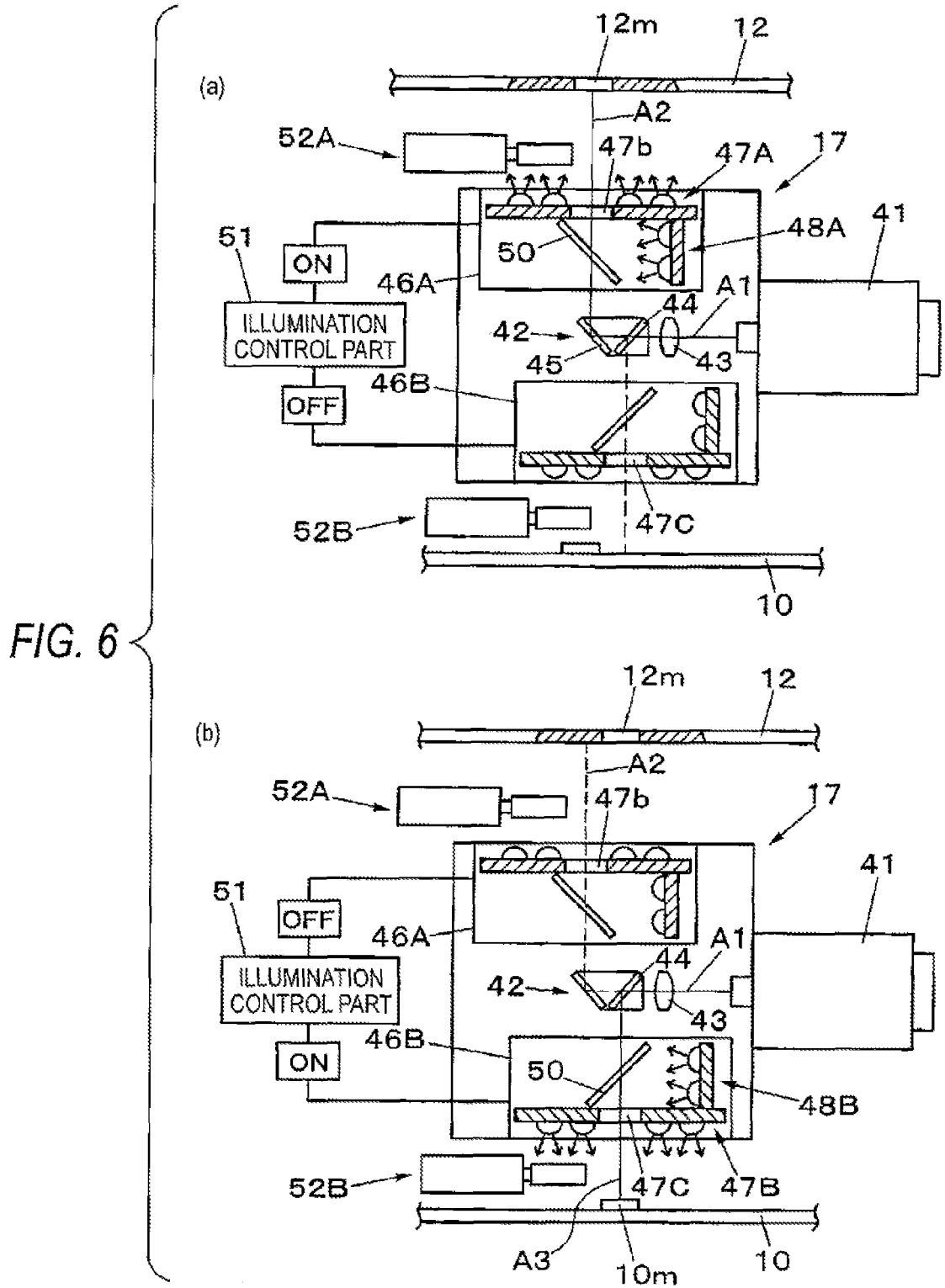
FIGS. 6(a) and 6(b) are operation illustrations of mark imaging operations in the screen printing device of the embodiment of the present invention.

That is, in a mask imaging step in which the mask recognition mark 12m is imaged, as shown in FIG. 6(a), the upper imaging optical axis A2 is aligned to the mask recognition mark 12m, and in a state that the upper shuttering mechanism 52A is open, the upper illuminating part 46A becomes an operation ON state and the lower illuminating part 46B becomes an operation OFF state. Thereby, the imaging light of the mask recognition mark 12m, which is the illumination light of the upper illuminating part 46A that is reflected by the bottom surface of the screen mask 12, is incident on the mirror 45 through the upper imaging optical axis A2. The imaging light totally reflected by the mirror 45 passes through the mirror 45 and is incident on the camera 41 through the incidence optical axis A1, and an image of the mask recognition mark 12m is imaged in the total range of the imaging field of the camera 41. At this time, because the lower illuminating part 46B is in an operation OFF state, there is extremely little light that is incident as disturbance light from the lower imaging opening 47c, and a clear image of the mask recognition mark 12m is imaged in the camera 41.

In a board imaging step in which the board recognition mark 10m is imaged, as shown in FIG. 6(b), the lower imaging optical axis A3 is aligned to the board recognition mark 10m, and in a state that the lower shuttering mechanism 52B is open, the lower illuminating part 46B becomes an operation ON state and the upper illuminating part 46A becomes an operation OFF state. Thereby, the imaging light of the board recognition mark 10m, which is the illumination light of the lower illuminating part 46B that is reflected by the top surface of the board 10, is incident on the half mirror 44. The imaging light semi-reflected by the half mirror 44 is incident on the camera 41 through the incidence optical axis A1, and an image of the board recognition mark 10m is imaged in the total range of the imaging field of the camera 41. At this time, because the upper illuminating part 46A is in an operation OFF state, there is extremely little light that is incident as disturbance light from the upper imaging opening 47b, and a clear image of the board recognition mark 10m is imaged in the camera 41.

Because the upper imaging optical axis A2 and the lower imaging optical axis A3 are offset by a predetermined distance D in the construction of the imaging part 17, the following effects are achieved in the board imaging step for the board recognition mark 10m shown in FIG. 6(b). That is, disturbance light is always incident from the mask recognition mark 12m because there is an opened space above the screen mask 12, but the position of the imaging opening 47b is offset from the mask recognition mark 12m in the board imaging step for the board recognition mark 10m. Therefore, the disturbance light from the mask recognition mark 12m will not be directly incident from the imaging opening 47b, and thus the disturbance light has little influence on the imaging of the mask recognition mark 12m that is performed through the lower imaging optical axis A3.

Figure 7:
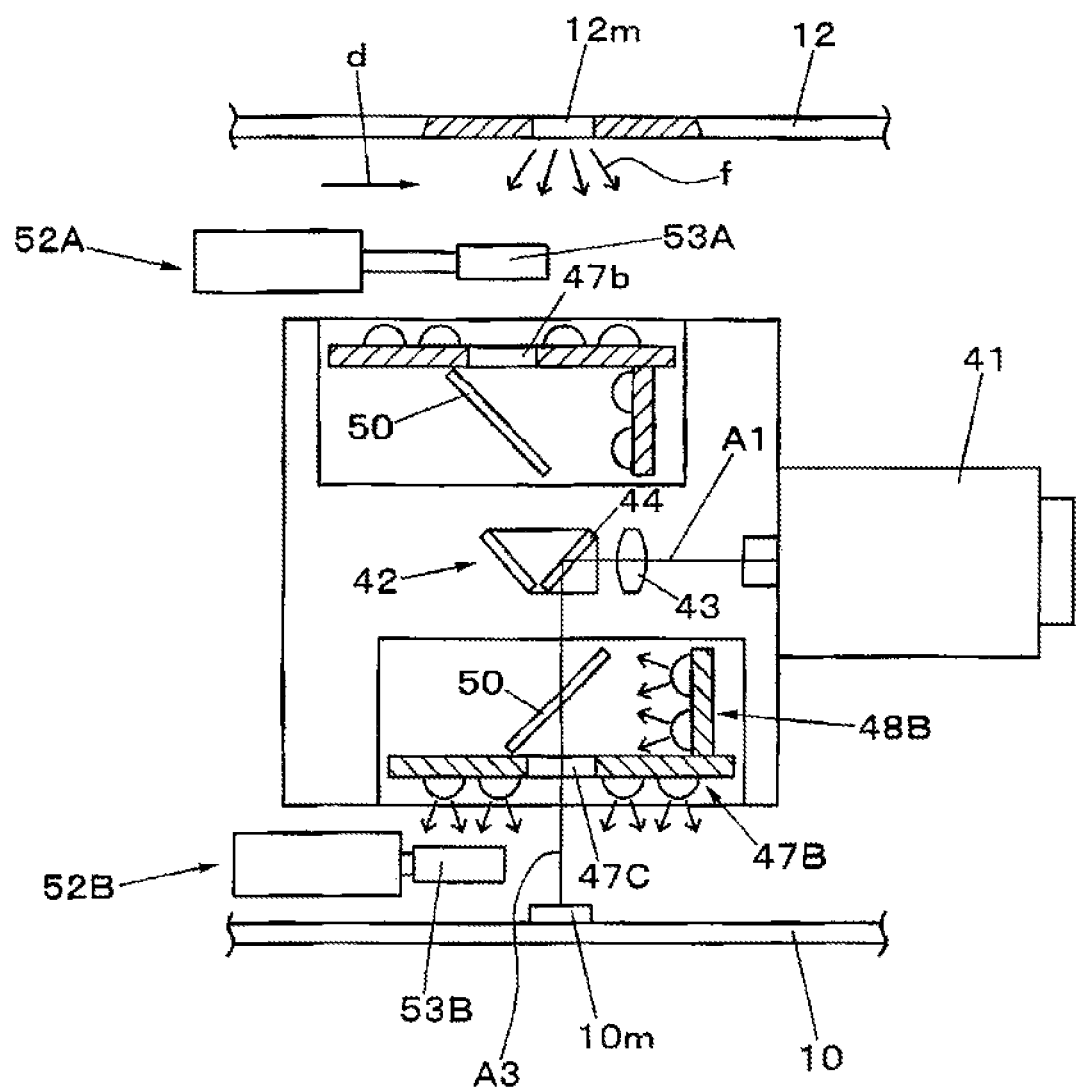
FIG. 7 is an operation illustration of the mark imaging operations in the screen printing device of the embodiment of the present invention.

In the board imaging step for the board recognition mark 10m, as shown in FIG. 7, the upper shuttering member 53A in the upper shuttering mechanism 52A is moved back and forth (arrow d) to a position where the imaging opening 47b is covered from above. Thereby, light amount of the disturbance light incident from the imaging opening 47b can be remarkably decreased, and the above-mentioned effect is further improved.

As described above, for the screen printing device and the image recognizing method in the screen printing device shown in the present embodiment, there is the imaging part 17 which performs the mark imaging operation of imaging the mask recognition mark 12m through the upper imaging optical axis A2 and imaging the board recognition mark 10m through the lower imaging optical axis A3. The imaging part 17 includes the single camera 41 which is disposed with a posture of horizontally facing towards the incidence optical axis A1 through which an imaging light is incident, the half mirror 44 which makes an imaging light, which is incident through the lower imaging optical axis A3, to be incident on the camera 41, and the mirror 45 which makes an imaging light, which is incident through the upper imaging optical axis A2, to pass through the half mirror 44 and to be incident on the camera 41. Further, the imaging part 17 is constructed to have the upper illuminating part 46A and the lower illuminating part 46B which individually illuminate the imaging objects at the time of imaging through the upper imaging optical axis A2 and at the time of imaging through the lower imaging optical axis A3, respectively, and the imaging part 17 adopts an imaging method of taking imaging light in the camera 41 in a state that the upper illuminating part 46A and the lower illuminating part 46B are individually operated in the mask imaging step and the board imaging step respectively.

Thereby, the problem in the related art is solved that a single camera cannot image in both the upwards direction and the downwards direction. That is, the drop of resolution and recognition precision due to that the screen mask and the board are recognized by dividing the imaging field of a camera into a top half and a bottom half can be prevented, and the drop of recognition precision due to the influence of disturbance light because imaging lights are incident from the upwards and downwards coaxial directions can be prevented. Thereby, by using the recognizing device of a simple construction including the single camera 41, the recognition precisions of the screen mask 12 and the board 10 can be secured.

The invention is intended to cover various alterations and applications made by those who are skilled in the art on the basis of the description of the specification and well-known technology without departing from the spirit and scope of the present invention, and these alterations and applications shall fall within a range where protection of the invention is sought. In a range without departing from the spirit of the invention, the component elements in the above embodiment may be combined arbitrarily.

This application is based on the Japanese patent application (patent application 2011-144033) filed on Jun. 29, 2011, whose content is incorporated herein by reference.

INDUSTRIAL APPLICABILITY

The screen printing device and the image recognizing method in the screen printing device of the invention is characterized in that the recognition precisions of the screen mask and the board can be secured by using the recognizing device of a simple construction including the single camera, and is applicable in a screen printing field in which paste such as cream solder or conductive paste is printed on a board.

DESCRIPTION OF THE NUMBERS 1 board positioning part
8 board conveying mechanism
10 board
10m recognition mark
11 screen printing part
12 screen mask
12m recognition mark
17 imaging part
21 imaging part moving mechanism
41 camera
42 imaging optical system
44 half mirror
45 mirror
46A upper illuminating part
46B lower illuminating part
A1 incidence optical axis
A2 upper imaging optical axis
A3 lower imaging optical axis

The invention claimed is:

1. A screen printing device which makes a screen mask provided with a pattern hole to abut against a board so as to print a paste, comprising:

a board positioning part which holds a board transported from an upstream and positions the board to a predetermined position by moving the board relatively in a horizontal direction and in a vertical direction;

a screen printing part which prints the paste on the board through the pattern hole by sliding a squeegee on the screen mask to which the paste is supplied;

an imaging part which has an upper imaging optical axis and a lower imaging optical axis whose imaging directions are an upwards direction and a downwards direction, respectively, and whose planar positions are offset by a predetermined distance, the imaging part performing a mark imaging operation imaging a mask recognition mark formed on the screen mask through the upper imaging optical axis, and imaging a board recognition mark formed on the board through the lower imaging optical axis; and an imaging part moving mechanism which horizontally moves the imaging part relative to the board and the screen mask;

wherein the imaging part comprises a single camera disposed with a posture of horizontally facing towards an incidence optical axis through which an imaging light is incident;

a third half mirror having a semi-reflective surface disposed to obliquely face downwards and towards the camera, and horizontally reflecting an imaging light, which is incident through the lower imaging optical axis, to be incident on the camera through the incidence optical axis, a mirror which has a full reflective surface that is disposed to obliquely face downwards and towards the camera, which is disposed at a position further than the third half mirror from the camera, and which horizontally reflects an imaging light which is incident through the upper imaging optical axis to pass through the third half mirror and then be incident on the camera through the incidence optical axis, and an upper illuminating part and a lower illuminating part which individually illuminate respective imaging objects at the time of imaging through the upper imaging optical axis and at the time of imaging through the lower imaging optical axis, and the upper illuminating part includes a first vertical illumination board and a first half mirror obliquely opposed to the first vertical illumination board, the lower illuminating part includes a second vertical illumination board and a second half mirror obliquely opposed to the second vertical illumination board, by operating the first vertical illumination board, the imaging object is irradiated with an illumination light, which is reflected upwards by the first half mirror, from the coaxial direction of the upper imaging optical axis, and by operating the second vertical illumination board, the imaging object is irradiated with an illumination light, which is reflected downwards by the second half mirror, from the coaxial direction of the lower imaging optical axis, wherein the imaging part further comprises an illumination control part which switches to operate the upper illuminating part and the lower illuminating part according to the imaging objects.

2. The screen printing device according to claim 1, wherein the imaging part further comprises a shuttering mechanism which switches the covering and the opening of an imaging opening which the upper imaging optical axis penetrates when a shuttering member is moved back and forth by a back and forth driving mechanism.

3. The screen printing device according to claim 1, wherein the upper illuminating part further includes a first horizontal illumination board being operated to irradiate the imaging object above with an illumination light, and the lower illuminating part further includes a second horizontal illumination board being operated to irradiate the imaging object below with an illumination light.

4. An image recognizing method, in which a board recognition mark and a mask recognition mark are imaged and recognized by an imaging part, in a screen printing device which makes a screen mask provided with a pattern hole to abut against a board so as to print a paste and which comprises a board positioning part which holds a board transported from an upstream and positions the board to a predetermined position by moving the board relatively in a horizontal direction and in a vertical direction, a screen printing part which prints the paste on the board through the pattern holes by sliding a squeegee on the screen mask to which the paste is supplied, the imaging part which has an upper imaging optical axis and a lower imaging optical axis whose imaging directions are an upwards direction and a downwards direction, respectively, and whose planar positions are offset by a predetermined distance, and which performs a mark imaging operation in which the mask recognition mark formed on the screen mask is imaged through the upper imaging optical axis, and the board recognition mark formed on the board is imaged through the lower imaging optical axis, and an imaging part moving mechanism which horizontally moves the imaging part relative to the board and the screen mask, wherein the imaging part comprises a single camera which is disposed with a posture of horizontally facing towards an incidence optical axis through which an imaging light is incident, a third half mirror which has a semi-reflective surface which is disposed to obliquely face downwards and towards the camera, and which horizontally reflects an imaging light, which is incident through the lower imaging optical axis, to be incident on the camera through the incidence optical axis, a mirror which has a full reflective surface that is disposed to obliquely face downwards and towards the camera, which is disposed at a position further than the third half mirror from the camera, and which horizontally reflects an imaging light, which is incident through the upper imaging optical axis, to pass through the third half mirror and then be incident on the camera through the incidence optical axis, and an upper illuminating part and a lower illuminating part which individually illuminate respective imaging objects at the time of imaging through the upper imaging optical axis and at the time of imaging through the lower imaging optical axis, and the upper illuminating part includes a first vertical illumination board and a first half mirror obliquely opposed to the first vertical illumination board, the lower illuminating part includes a second vertical illumination board and a second half mirror obliquely opposed to the second vertical illumination board, by operating the first vertical illumination board, the imaging object is irradiated with an illumination light, which is reflected upwards by the first half mirror, from the coaxial direction of the upper imaging optical axis, by operating the second vertical illumination board, the imaging object is irradiated with an illumination light, which is reflected downwards by the second half mirror, from the coaxial direction of the lower imaging optical axis, wherein, in a mask imaging step of imaging the mask recognition mark, in a state that the upper illuminating part is operated, an imaging light of the mask recognition mark is incident on the mirror through the upper imaging optical axis, and in a board imaging step of imaging the board recognition mark, in a state that the lower illuminating part is operated, an imaging light of the board recognition mark is incident on the third half mirror through the lower imaging optical axis.

5. The image recognizing method in the screen printing device according to claim 4, wherein the imaging part further comprises a shuttering mechanism which switches the covering and the opening of an imaging opening which the upper imaging optical axis penetrates when a shuttering member is moved back and forth by a back and forth driving mechanism, and in the board imaging step, by operating the shuttering mechanism, the shuttering member is moved to and from a position where the imaging opening which the upper imaging optical axis penetrates is covered.

6. The image recognizing method in the screen printing device according to claim 4, wherein the upper illuminating part further includes a first horizontal illumination board being operated to irradiate the imaging object above with an illumination light, and the lower illuminating part further includes a second horizontal illumination board being operated to irradiate the imaging object below with an illumination light.

* * * * *